US012603245B2

(12) United States Patent
Schubert

(10) Patent No.: US 12,603,245 B2
(45) Date of Patent: Apr. 14, 2026

(54) MULTIPLE PARTICLE BEAM SYSTEM WITH A CONTRAST CORRECTION LENS SYSTEM

(71) Applicant: Carl Zeiss MultiSEM GmbH, Oberkochen (DE)

(72) Inventor: Stefan Schubert, Oberkochen (DE)

(73) Assignee: Carl Zeiss MultiSEM GmbH, Oberkochen (DE)

( * ) Notice: Subject to any disclaimer, the term of this patent is extended or adjusted under 35 U.S.C. 154(b) by 531 days.

(21) Appl. No.: 18/167,991

(22) Filed: Feb. 13, 2023

(65) Prior Publication Data

US 2023/0207251 A1     Jun. 29, 2023

Related U.S. Application Data

(63) Continuation of application No. PCT/EP2021/025331, filed on Sep. 7, 2021.

(30) Foreign Application Priority Data

Sep. 9, 2020     (DE) .......................... 102020123567.4

(51) Int. Cl.
H01J 37/147     (2006.01)
H01J 37/143     (2006.01)
H01J 37/244     (2006.01)

(52) U.S. Cl.
CPC ........ H01J 37/1478 (2013.01); H01J 37/143 (2013.01); H01J 37/244 (2013.01); (Continued)

(58) Field of Classification Search
CPC .... H01J 37/1478; H01J 37/143; H01J 37/244; H01J 2237/1035; H01J 2237/1502; (Continued)

(56) References Cited

U.S. PATENT DOCUMENTS 4,130,761 A     12/1978  Matsuda
4,153,843 A     5/1979  Pease
(Continued)

FOREIGN PATENT DOCUMENTS

CN          104685602 A     6/2015
DE     10 2013 014 976 A1     3/2015
(Continued)

OTHER PUBLICATIONS

Office Action in corresponding Korean Appln. No. 10-2023-7010618, dated Feb. 28, 2025, 20 pages (with English translation).
(Continued)

*Primary Examiner* — Wyatt A Stoffa
*Assistant Examiner* — Christopher J Gassen
(74) *Attorney, Agent, or Firm* — Fish & Richardson P.C.

(57)     ABSTRACT

A multiple particle beam system comprises a magnetic immersion lens and a detection system. A cross-over of the second individual particle beams is provided in the secondary path between the beam switch and the detection system, and a contrast aperture with a central cutout for cutting out the secondary beams is arranged in the region of the cross-over. A contrast correction lens system with a first magnetic contrast correction lens is arranged between the objective lens and the contrast aperture. The contrast correction lens system is configured to generate a magnetic field with an adjustable strength and correct beam tilts of the secondary beams in the cross-over in relation to the optical axis of the
(Continued)

multiple particle beam system. It is possible to obtain a more uniform contrast for different individual images and the contrast can be improved overall.

20 Claims, 9 Drawing Sheets

(52) U.S. Cl.
CPC .................. *H01J 2237/1035* (2013.01); *H01J 2237/1502* (2013.01); *H01J 2237/152* (2013.01); *H01J 2237/153* (2013.01)

(58) Field of Classification Search
CPC ........... H01J 2237/152; H01J 2237/153; H01J 2237/2446; H01J 37/141; H01J 37/28
See application file for complete search history.

(56) References Cited

U.S. PATENT DOCUMENTS

| | | | |
|---|---|---|---|
| 4,200,794 A | 4/1980 | Newberry | |
| 4,338,548 A | 7/1982 | Bono | |
| 4,742,234 A | 5/1988 | Feldman | |
| 5,215,623 A | 6/1993 | Takahashi | |
| 5,864,142 A | 1/1999 | Muraki | |
| 5,892,224 A | 4/1999 | Nakasuji | |
| 5,905,267 A | 5/1999 | Muraki | |
| 5,981,954 A | 11/1999 | Muraki | |
| 6,107,636 A | 8/2000 | Muraki | |
| 6,124,599 A | 9/2000 | Muraki | |
| 6,137,113 A | 10/2000 | Muraki | |
| 6,323,499 B1 | 11/2001 | Muraki | |
| 6,333,508 B1 | 12/2001 | Katsap | |
| 6,388,261 B1 * | 5/2002 | Nakasuji | ............. H01J 37/3174 |
| | | | 250/398 |
| 6,617,595 B1 | 9/2003 | Okunuki | |
| 6,633,366 B2 | 10/2003 | De Jager | |
| 6,696,371 B2 | 2/2004 | Butschke | |
| 6,787,780 B2 | 9/2004 | Hamaguchi | |
| 6,804,288 B2 | 10/2004 | Haraguchi | |
| 6,818,911 B2 | 11/2004 | Tamamori | |
| 6,835,508 B2 | 12/2004 | Butschke | |
| 6,872,950 B2 | 3/2005 | Shimada | |
| 6,903,345 B2 | 6/2005 | Ono | |
| 6,903,353 B2 | 6/2005 | Muraki | |
| 6,917,045 B2 | 7/2005 | Hashimoto | |
| 6,919,574 B2 | 7/2005 | Hashimoto | |
| 6,943,349 B2 | 9/2005 | Adamec | |
| 6,953,938 B2 | 10/2005 | Iwasaki | |
| 6,992,290 B2 | 1/2006 | Watanabe | |
| 7,005,658 B2 | 2/2006 | Muraki | |
| 7,015,467 B2 | 3/2006 | Maldonado | |
| 7,060,984 B2 | 6/2006 | Nagae | |
| 7,084,411 B2 | 8/2006 | Lammer-Pachlinger | |
| 7,091,504 B2 | 8/2006 | Wieland | |
| 7,109,494 B2 | 9/2006 | Ono | |
| 7,126,141 B2 | 10/2006 | Ono | |
| 7,129,502 B2 | 10/2006 | Kruit | |
| 7,244,949 B2 | 7/2007 | Knippelmeyer | |
| 7,285,779 B2 | 10/2007 | Litman | |
| 7,332,730 B2 | 2/2008 | Heinitz et al. | |
| 7,375,326 B2 | 5/2008 | Sender | |
| 7,420,164 B2 | 9/2008 | Nakasuji | |
| 7,468,507 B2 | 12/2008 | Rogers | |
| 7,504,622 B2 | 3/2009 | Elyasaf | |
| 7,535,001 B2 | 5/2009 | Sender | |
| 7,601,972 B2 | 10/2009 | Nakasuji | |
| 7,619,203 B2 | 11/2009 | Elyasaf | |
| 7,696,497 B2 | 4/2010 | Rogers | |
| 8,035,082 B2 | 10/2011 | Yamazaki | |
| 8,134,135 B2 | 3/2012 | Kruit | |
| 8,350,214 B2 | 1/2013 | Otaki | |
| 8,362,425 B2 | 1/2013 | Han | |
| 8,384,051 B2 | 2/2013 | Ozawa | |
| 8,598,525 B2 | 12/2013 | Zeidler | |
| 8,618,496 B2 | 12/2013 | Wieland | |
| 8,704,192 B2 | 4/2014 | Sano | |
| 8,748,842 B2 | 6/2014 | Ohashi | |
| 8,779,399 B2 | 7/2014 | Yamanaka | |
| 8,829,465 B2 | 9/2014 | Tsunoda | |
| 8,963,099 B2 | 2/2015 | Yamada | |
| 9,153,413 B2 | 10/2015 | Almogy | |
| 9,263,233 B2 | 2/2016 | Zeidler | |
| 9,336,981 B2 | 5/2016 | Knippelmeyer | |
| 9,336,982 B2 | 5/2016 | Zeidler | |
| 9,349,571 B2 | 5/2016 | Kemen | |
| 9,368,314 B2 | 6/2016 | Nakasuji | |
| 9,530,613 B2 | 12/2016 | Rogers | |
| 9,536,702 B2 | 1/2017 | Lang | |
| 9,607,805 B2 | 3/2017 | Liu | |
| 9,653,254 B2 | 5/2017 | Zeidler | |
| 9,666,405 B1 | 5/2017 | Lanio | |
| 9,666,406 B1 | 5/2017 | Lanio | |
| 9,702,983 B2 | 7/2017 | Eder | |
| 9,922,799 B2 | 3/2018 | Li | |
| 9,991,089 B2 | 6/2018 | Mueller | |
| 10,062,541 B2 | 8/2018 | Ren | |
| 10,141,160 B2 | 11/2018 | Ren | |
| 10,354,831 B2 | 7/2019 | Kemen | |
| 10,388,487 B2 | 8/2019 | Zeidler | |
| 10,535,494 B2 | 1/2020 | Zeidler | |
| 10,541,112 B2 | 1/2020 | Schubert | |
| 10,586,677 B1 | 3/2020 | Okada | |
| 10,600,613 B2 | 3/2020 | Zeidler | |
| 10,622,184 B2 | 4/2020 | Knippelmeyer | |
| 10,643,820 B2 | 5/2020 | Ren | |
| 10,741,355 B1 | 8/2020 | Zeidler | |
| 10,811,215 B2 | 10/2020 | Zeidler | |
| 10,854,423 B2 | 12/2020 | Sarov | |
| 10,879,031 B2 | 12/2020 | Ren | |
| 10,896,800 B2 | 1/2021 | Riedesel | |
| 2004/0124356 A1 | 7/2004 | Scholtz et al. | |
| 2009/0014649 A1 | 1/2009 | Nakasuji | |
| 2014/0151570 A1 | 6/2014 | Kato et al. | |
| 2014/0158885 A1 * | 6/2014 | Noji | ........................ H01J 37/28 |
| | | | 250/307 |
| 2014/0197325 A1 | 7/2014 | Kato | |
| 2015/0228449 A1 | 8/2015 | Kawanishi et al. | |
| 2015/0287568 A1 | 10/2015 | Rodgers | |
| 2017/0133198 A1 | 5/2017 | Kruit | |
| 2017/0154756 A1 * | 6/2017 | Ren | ........................ H01J 37/292 |
| 2018/0144905 A1 | 5/2018 | Iizuka et al. | |
| 2019/0279844 A1 | 9/2019 | Ren | |
| 2019/0333732 A1 | 10/2019 | Ren | |
| 2020/0211810 A1 | 7/2020 | Zeidler | |
| 2020/0243300 A1 | 7/2020 | Zeidler | |
| 2020/0373116 A1 | 11/2020 | Zeidler | |
| 2021/0005423 A1 | 1/2021 | Zeidler | |
| 2021/0035773 A1 | 2/2021 | Zeidler | |
| 2021/0142980 A1 | 5/2021 | Zeidler et al. | |

FOREIGN PATENT DOCUMENTS

| | | | |
|---|---|---|---|
| DE | 10 2013 016 113 A1 | 3/2015 | |
| DE | 10 2018 115 012 A1 | 12/2019 | |
| GB | 2519511 A | 4/2015 | |
| GB | 2521819 A | 7/2015 | |
| JP | 59184524 A | 10/1984 | |
| JP | 60042825 A | 3/1985 | |
| JP | 60105229 A | 6/1985 | |
| JP | 61263217 A | 11/1986 | |
| JP | 2014229481 A | 12/2014 | |
| JP | 2018-535525 A | 11/2018 | |
| KR | 10-2005-0050658 A | 5/2005 | |
| KR | 10-2018-0097597 A | 8/2018 | |
| TW | 201830151 A | 8/2018 | |
| WO | WO 2005/024881 A2 | 3/2005 | |
| WO | WO 2007/028595 A2 | 3/2007 | |
| WO | WO 2007/028596 A1 | 3/2007 | |
| WO | WO 2007/060017 A2 | 5/2007 | |
| WO | WO 2011/124352 A1 | 10/2011 | |
| WO | WO2013032949 A1 | 3/2013 | |
| WO | WO 2019/243349 A2 | 12/2019 | |

(56)                    References Cited

FOREIGN PATENT DOCUMENTS

| WO | WO2020057678 | A1 | 3/2020 |
| WO | WO2020064035 | A1 | 4/2020 |
| WO | WO2020065094 | A1 | 4/2020 |
| WO | WO2020070074 | A1 | 4/2020 |
| WO | WO2020151904 | A2 | 7/2020 |
| WO | WO2020249147 | A1 | 12/2020 |

OTHER PUBLICATIONS

Office Action in corresponding Japanese Appln. No. 2023-515846, mailed on Mar. 4, 2024, 8 pages (with English translation).
Office Action and Search Report in Taiwanese Appln. No. 110133150, mailed on Jun. 30, 2025, 11 pages (with English translation).

* cited by examiner

MULTIPLE PARTICLE BEAM SYSTEM WITH A CONTRAST CORRECTION LENS SYSTEM

CROSS-REFERENCE TO RELATED APPLICATIONS

The present application is a continuation of, and claims benefit under 35 USC 120 to, international application PCT/EP2021/025331, filed Sep. 7, 2021, which claims benefit under 35 USC 119 of German Application No. 10 2020 123 567.4, filed Sep. 9, 2020. The entire disclosure of these applications are incorporated by reference herein.

FIELD

The disclosure relates to particle beam systems which operate with a multiplicity of particle beams.

BACKGROUND

Similar single-beam particle microscopes, multi-beam particle microscopes can be used to analyse objects on a microscopic scale. Images of an object that can represent a surface of the object, for example, can be recorded using these particle microscopes. In this way, for example the structure of the surface can be analysed. While in a single-beam particle microscope a single particle beam of charged particles, such as, for example, electrons, positrons, muons or ions, is used to analyse the object, in a multi-beam particle microscope, a plurality of particle beams are used for this purpose. The plurality of the particle beams, also referred to as a bundle, are directed at the surface of the object at the same time, as a result of which a significantly larger area of the surface of the object can be sampled and analysed as compared with a single-beam particle microscope within the same period of time.

WO 2005/024 881 A2 discloses a multiple particle beam system in the form of an electron microscopy system which operates with a multiplicity of electron beams in order to scan an object to be examined using a bundle of electron beams in parallel. The bundle of electron beams is generated by an electron beam generated by an electron source being directed at a multi-aperture plate having a multiplicity of openings. One portion of the electrons of the electron beam strikes the multi-aperture plate and is absorbed there, and another portion of the beam passes through the openings in the multi-aperture plate, and so an electron beam is shaped in the beam path downstream of each opening, the cross section of the electron beam being defined by the cross section of the opening. Furthermore, suitably chosen electric fields provided in the beam path upstream and/or downstream of the multi-aperture plate have the effect that each opening in the multi-aperture plate acts as a lens on the electron beam passing through the opening, and so the electron beams are focused on a plane situated at a distance from the multi-aperture plate. The plane in which the foci of the electron beams are formed is imaged by a downstream optical unit onto the surface of the object to be examined, such that the individual electron beams strike the object in a focused manner as primary beams. There they generate interaction products, such as back-scattered electrons or secondary electrons, emanating from the object, which are shaped to form secondary beams and are directed at a detector by a further optical unit. There each of the secondary beams strikes a separate detector element such that the electron intensities detected by the detector element provide information relating to the object at the location at which the corresponding primary beam strikes the object. The bundle of primary beams is scanned systematically over the surface of the object in order to generate an electron micrograph of the object in the manner that is customary for scanning electron microscopes.

In the aforementioned multiple particle beam systems magnetic immersion lenses are frequently used as objective lenses. Here, the object plane is situated within the magnetic field of the objective lens. Secondary beams emanating from a given incidence location on the object therefore pass through an asymmetric magnetic field which leads to an undesirable tilt of the particle beam in the downstream particle optical beam path. This tilt can leads to issues with the precision for particle optical imaging in focal planes and also in the case of a beam crossing ("crossover").

An aperture (contrast aperture) is usually arranged between the object and the detector array in the region of a crossover and it should firstly prevent crosstalk between the secondary beams and secondly facilitate a good contrast (edge contrast) which is uniform over all secondary beams for the imaging via the detector array. However, this presumes that all beams that pass through the aperture are incident centrally on the latter in relation to the optical axis. Generally, only this allows precise filtering of the secondary beams in relation to the start angle when starting from the sample/the object plane. However, this presumes that the secondary beams are not tilted with respect to one another. Here, the degree of this tilt generally depends on the position of a secondary beam in the field of secondary beams. Beams located further to the outside in the field are generally tilted more strongly.

WO2019243349A2 discloses a multiple particle beam system which comprises a deflector array in the region of an intermediate image plane in the secondary path. This allows individual tilted secondary beams to be deflected in targeted fashion and be corrected in terms of their propagation directions. However, this can involve relatively high precision in the production and arrangement with respect to one another of numerous components of the deflector array and moreover can involve complex control of the individual components.

U.S. Pat. No. 9,666,405 B1 discloses a multi-beam particle microscope with a mechanism for adjusting a grid rotation upon incidence on a detector. To this end, a magnetic lens is arranged upstream of the detector and the positions of the secondary individual particle beams are altered on account of the Lorentz force acting on the particle beams. This relates to adjusting rotation only. The issue of a beam tilt which leads to skew pencils of rays in a cross-over plane downstream of the objective lens and hence to (slightly) different image contrasts is not mentioned in the document.

U.S. Pat. No. 9,666,406 B1 discloses a multi-beam particle microscope with a mechanism for adjusting a grid rotation upon incidence on a sample. To this end, a magnetic lens is arranged between the particle source and the objective lens and the positions of the secondary individual particle beams are altered on account of the Lorentz force acting on the particle beams. This relates to adjusting rotation only. The issue of a beam tilt which leads to skew pencils of rays in a cross-over plane of the secondary individual particle beams downstream of the objective lens and hence to (slightly) different image contrasts is not mentioned in the document.

SUMMARY

The present disclosure seeks to provide an alternative multiple particle beam system which facilitates a better and/or more uniform contrast and/or a better resolution. For example, this contrast improvement can be uniformly obtainable for all beams, even in the case of a small contrast aperture and even when using a great number of individual particle beams. The contrast improvement in the multiple particle beam system can also be obtainable for planar samples such as semiconductor wafers, for example, which have practically no topography contrast.

For example, the disclosure seeks to ensure that a contrast aperture arranged in the cross-over plane of secondary beams cuts out/allows passing through the same angle components from each secondary beam.

The disclosure also seeks to optionally set telecentric illumination at the detector.

The disclosure also seeks to telecentrically illuminate a sample.

The following concepts relating to the way in which a different contrast arises in the case of individual images form a basis of the disclosure: Secondary beams leave the sample surface at each excitation point within a large, inhomogeneously filled beam cone. The ideal position of a secondary beam in the plane of the cross-over (crossing plane) or pupil plane corresponds to the beam angles within the beam cone as received by the objective lens, i.e., each secondary beam passes through the cross-over plane with a distribution corresponding to the inhomogeneously filled beam cone.

The contrast aperture cuts out a section from the inhomogeneously filled beam cone of each secondary beam and the cut out beam current is detected by a detection element for each secondary beam. If two different sections are cut out from the inhomogeneously filled beam cones of two secondary beams there are contrast differences between the partial images of the two beams. Thus, improving the contrast according to the disclosure does not relate to a greater contrast per se, but relates to each partial image of the multi-beam system to generate the same image contrast. If, theoretically or as a test, an object is laterally offset by a beam pitch of the individual particle beams and a new image is captured, the latter desirably does not differ from the first image of the non-displaced object.

Secondary beams that emanate from a given incidence location on the object and pass through an asymmetric magnetic field can be undesirably tilted in the downstream particle optical beam path. This tilt can depend on the degree of the azimuthal velocity component which, in turn, depends on the distance of the excitation points from the optical axis. An off-axis secondary particle beam cone thus turns into a so-called skew pencil of rays, which may no longer be centered on the optical axis in the pupil plane (=cross-over plane).

If skew pencils of rays are superposed in the cross-over plane, the contrast aperture (with a circular opening whose midpoint is located on the optical axis) arranged there can cut out a slightly different section from each skew pencil of rays. These different sections then result in the above-described contrast differences.

The disclosure now chooses the approach of reducing or avoiding occurrences in which different sections are cut out by the contrast aperture, by virtue of fewer or no skew pencils of rays being present in the cross-over plane anymore. Expressed differently, the secondary individual particle beams are superposed more precisely and in greater axisymmetric fashion in the cross-over plane. This correction is a new type of precision correction.

According to a first aspect of the disclosure, the latter relates to a multiple particle beam system, comprising the following: a multi-beam particle source, which is configured to generate a first field of a multiplicity of charged first particle beams; a first particle-optical unit with a first particle-optical beam path, configured to image the generated individual particle beams onto an object plane such that the first particle beams strike an object at incidence locations, which form a second field; a detection system with a multiplicity of detection regions that form a third field, a second particle optical unit with a second particle optical beam path, which is configured to image second individual particle beams, which emanate from the incidence locations in the second field, onto the third field of the detection regions of the detection system; a magnetic objective lens, for example a magnetic immersion lens, through which both the first and the second individual particle beams pass; a beam switch, which is arranged in the first particle optical beam path between the multi-beam particle source and the objective lens and which is arranged in the second particle optical beam path between the objective lens and the detection system; and a controller; wherein there is a cross-over of the second individual particle beams in the second particle optical beam path between the beam switch and the detection system, wherein a contrast aperture with a central cutout for cutting out the second individual particle beams is arranged in the region of the cross-over, wherein a contrast correction lens system with a first magnetic contrast correction lens is arranged in the second particle optical beam path between the objective lens and the contrast aperture, the first magnetic contrast correction lens being configured to generate a magnetic field with an adjustable strength and correct beam tilts of the second individual particle beams in the cross-over in relation to the optical axis of the multiple particle beam system, and wherein the controller is configured to control the excitation of the contrast correction lens system.

The charged particles can be, e.g., electrons, positrons, muons or ions or other charged particles. Optionally, the charged particles can be electrons generated, e.g., using a thermal field emission source (TFE). However, other particle sources can also be used.

The number of first individual particle beams is able to be chosen variably in this case. However, it can be desirable for the number of particle beams is $3n(n-1)+1$, where n is any natural number. This can allow a hexagonal grid arrangement of the detection regions. Other grid arrangements of the detection regions, e.g., in a square or rectangular grid, are possible. By way of example, the number of first individual particle beams is more than 5, more than 60 or more than 100 individual particle beams.

According to the disclosure, a cross-over of the second individual particle beams in the second particle optical beam path can be provided between the beam switch and the detection system. Additionally, a contrast aperture with a central cutout is arranged in the region of the cross-over. The second individual particle beams can be exactly superposed in the region of the cross-over. Then, it is possible to choose the contrast aperture with its central cutout in such a way that a majority of the beam intensity of each second individual particle beam is also maintained when cut out by the contrast aperture. This applies for example to second individual particle beams starting further away from the optical axis, which are relatively strongly affected by the tilt of the second individual particle beams when a magnetic immersion lens is used as an objective lens. Typically, this is only a remanent azimuthal or tangential tilt of an individual particle beam of a few degrees, for example approximately 2° or approximately 5°, in the case of weak immersion objective lenses. However, there can be a significantly more pronounced remanent azimuthal or tangential tilt in the case of strong immersion objective lenses, for example through approximately 30°, 40° or 50°, or even more. Here, an azimuthal or tangential tilt of an individual particle beam means a tilt or a directional component of an individual particle beam, which tilt or directional component is aligned perpendicular to an optical axis and perpendicular to a radial direction of the individual particle beam. The terms azimuthal or tangential should be understood to be synonymous designations, with a tangential directional component being a directional component which is tangential to a circumferential direction around an orbit perpendicular to the optical axis. That azimuthal or tangential tilt is also referred to here as Larmor rotation in simplified terms, the Larmor rotation in general comprising a pure twist of a grid arrangement of the individual particle beams and that azimuthal or tangential tilt of the individual particle beam. The term velocity component is also used in equivalent fashion for the term directional component.

The contrast correction lens system according to the disclosure can compensate relatively precisely this remanent azimuthal or tangential tilt. In this case, the contrast correction lens system comprises at least one first magnetic contrast correction lens, however it can also comprise a second, third, fourth or more magnetic contrast correction lenses. Compared to one another, these can have the same design or different designs. The cause for the tilt of the second individual particle beams lies in the Lorentz force or the Larmor rotation of the charged particles in the magnetic field. Accordingly, precisely this tilt is compensated according to the disclosure by a further magnetic field of adjustable strength. Here, this is a precision correction. Due to this, the magnetic field of the magnetic contrast correction lens(es) is comparatively weak and can extend over a comparatively long region along the optical axis, in order to perform the correction in the region. The second individual particle beams move on a helical trajectory in the magnetic field of the contrast correction lens(es). Optionally, it is designed in such a way here that there is less than a whole revolution within the magnetic field for correction purposes.

The multiple particle beam system can comprise a controller which is configured to control the excitation of the contrast correction lens system. The aforementioned controller can be a controller which controls the multiple particle beam system with its components overall. However, it is also possible to provide a separate controller for the contrast correction lens(es).

Optionally, the contrast correction lens system is arranged at a location or at locations in the second particle optical beam path where no further magnetic lens fields are otherwise present. This makes it easier to precisely set the Larmor rotation compensation which is a tilt correction in the cross-over.

In addition to the fact that this is a magnetic particle lens, the term magnetic contrast correction lens also contains the function of the lens for contrast correction. Thus, it is desirable for a contrast correction lens to be suitable and destined for contrast correction.

According to an embodiment of the disclosure, the first magnetic contrast correction lens is arranged in a region where the second individual particle beams run in convergent or divergent fashion during the operation of the multiple particle beam system.

According to an embodiment of the disclosure, the excitation of the contrast correction lens system is controlled in such a way that after passing through the contrast correction lens system the second individual particle beams run substantially parallel to the optical axis in a subsequent image plane or intermediate image plane of the second particle optical beam path and have substantially no varying azimuthal velocity components in the subsequent beam path outside magnetic lenses. The second individual particle beams can be incident on the detection system in telecentric fashion. Optionally, however, even further corrections can be involved to satisfy this telecentricity condition. According to an embodiment, a further contrast correction lens correcting a slight beam tilt—as described above—can be provided for a telecentric incidence onto a detector.

According to an embodiment of the disclosure, the excitation of the contrast correction lens system is controlled in such a way that after passing through the contrast correction lens system all second individual particle beams are substantially superposed in a subsequent crossover of the second particle optical beam path and pass through the crossover centrally in relation to the optical axis of the system. The second individual particle beams have substantially no varying azimuthal velocity components in the downstream beam path outside magnetic lenses. For example, the azimuthal velocity components can be zero. This is a precondition for all second individual particle beams being located exactly above one another in a cross-over and for achieving a uniform, high imaging contrast over all second individual particle beams. In this context, reference is also made to a homocentricity of the pencil of second individual particle beams and a midpoint or center ray of each second individual particle beam is practically located exactly on the optical axis of the system in the cross-over. The maximum deviation from the central beam axis (centroid ray) can be less than 4%, for example less than 2% and/or less than 1%, of the radius (cutout) of the utilized contrast aperture in this case. In this case, midpoint or center ray of each second individual particle beam means the ray of each second individual particle beam which is perpendicular to an object plane, in which for example the surface of the semiconductor wafer is arranged. In this case, the center ray can correspond to a centroid ray of a second individual particle beam.

According to an embodiment of the disclosure, the magnetic field of the first contrast correction lens is aligned substantially parallel to the optical axis of the system. Here, the magnetic contrast correction lens is arranged in a region of the second individual particle beams, in which the second individual particle beams run in convergent or divergent fashion with respect to one another in respect of the radial propagation direction, i.e., the second individual particle beams do not run parallel or in telecentric fashion with respect to one another. In turn, this causes the charged particles to move around the optical axis in a helical path within the magnetic field. Here, the magnetic field is substantially homogeneous. Second individual particle beams aligned along the optical axis or parallel to the optical axis are not deflected in the magnetic field of the first contrast correction lens as they do not have a radial velocity component. However, if the second individual particle beams run at an angle to the optical axis and hence also to the magnetic field, the Lorentz force acts on the second individual particle beams in the magnetic field and the contrast correction lens system can be used with the aid of the Larmor rotation to compensate the azimuthal velocity component. In a convergent or divergent pencil of second individual particle beams, the absolute value of a radial direction component of an individual particle beam in respect of an optical axis increases with increasing distance of an individual particle beam from the optical axis. In the axially aligned magnetic field of the contrast correction lens(es), a second individual particle beam consequently receives an azimuthal or tangential directional component which is proportional to the radial directional component and which counteracts the remanent azimuthal or tangential tilt. Consequently, there is a compensation of the remanent azimuthal or tangential tilt of the individual particle beams.

According to an embodiment of the disclosure, the length L of the first contrast correction lens is greater than the radius r of the contrast correction lens, i.e., L>r.

According to an embodiment of the disclosure, the length L of the first contrast correction lens is at least twice as long as a radius r of the contrast correction lens, i.e., L>2r. Here, the length L of the first contrast correction lens is measured along the optical axis of the system. By way of example, it corresponds to the pitch of two pole shoes of a magnetic contrast correction lens and/or the length over which the magnetic field is present and effective. By way of example, the radius r corresponds to half the opening width of the pole shoes, which may be for example a few cm, for example approximately 2 cm or 5 cm.

According to an embodiment of the disclosure, the length L of the first contrast correction lens is at least 15 cm, for example at least 20 cm and/or at least 30 cm. Thus, the installation of a contrast correction lens into a multiple particle beam system involves sufficient space therefor. However, a long contrast correction lens can be desirable because a comparatively weak magnetic field can be used for the contrast correction in a very targeted manner. By way of example, the axial magnetic field can have a magnetic field strength of approximately 1 mT. However, for more pronounced corrections, it can also be for example approximately 5 mT or approximately 15 mT.

According to an embodiment of the disclosure, the objective lens is a magnetic immersion lens. Here, this can be a weak immersion lens or a strong immersion lens. Magnetic immersion lenses are usually realized by the borehole in the outer pole shoe of the lens having a larger diameter than the borehole in the inner pole shoe of the lens. In contrast to objective lenses which provide only a low magnetic field at the object, immersion lenses can be able to achieve lower spherical and chromatic aberrations, and also can have greater off-axis aberrations. The stronger the magnetic field of immersion lens and the closer the immersion lens is positioned to the object plane, the more pronounced the Larmor rotation of the charged particles in the magnetic field is as well. This applies both to the first individual particle beams which are incident on the object and to the second individual particle beams which are released from the object.

According to an embodiment of the disclosure, the immersion lens provides a focusing magnetic field which provides a magnetic field strength in the object plane of greater than 10 mT, for example greater than 20 mT, 50 mT and/or 150 mT.

According to an embodiment of the disclosure, the second particle optical unit comprises a projection lens system which comprises a first projection lens system and a second projection lens system, wherein the first contrast correction lens is arranged between the first and the second projection lens system. It is possible that the first projection lens system has exactly one projection lens. However, it is also possible that it has two or more projection lenses. It is possible that the second projection lens system has exactly one projection lens. However, it is also possible that it has two or more projection lenses. It is also possible that the projection lens system comprises a third projection lens system. Then, too, it can be desirable for the first contrast correction lens to be arranged between the first and the second projection lens system and/or between the first and the second projection lens, i.e., the projection lens systems/projection lenses are enumerated in the direction of the particle optical beam path. The first projection lens (the first projection lens system) is frequently also referred to as a contrast lens (contrast lens system).

According to an embodiment of the disclosure, the second particle optical unit comprises a projection lens system, wherein the first contrast correction lens is arranged between the contrast aperture and the projection lens (contrast lens) closest thereto in the direction counter to the particle optical beam path. Thus, no further projection lens is situated between the first contrast correction lens and the contrast aperture in this case. Existing multiple particle beam systems have comparatively much space at this position, and so it is also possible to arrange a weak contrast correction lens, which generally will have a relatively large length L, at this position.

According to an embodiment of the disclosure, the projection lens system comprises at least one magnetic projection lens and/or consists of at least one magnetic projection lens.

According to another embodiment of the disclosure, the projection lens system comprises at least one electric projection lens and/or consists of at least one electric projection lens.

According to an embodiment of the disclosure, the contrast correction lens system comprises a second or further contrast correction lens.

According to an embodiment of the disclosure, the first contrast correction lens and/or a further contrast correction lens is arranged between the objective lens and the beam splitter. Here, the contrast correction lens can be arranged between the objective lens and the upper focal plane of the objective lens. However, it is alternatively or additionally also possible that the contrast correction lens is arranged between the upper focal plane of the objective lens and the beam switch. However, less installation space is available in each case in these two positions, and so contrast correction lenses that tend be shorter and stronger should be used here. Naturally, this however also depends on the effects to be corrected by the magnetic field of the objective lens. Moreover, the first individual particle beams also pass through the contrast correction lens at these installation positions. This fact can be used to also exactly set a telecentric incidence of the first individual particle beams on the object plane. In this case, the effect on the first individual particle beams and the second individual particle beams add constructively, i.e., the first individual particle beams and the second individual particle beams are deflected in the same direction by the contrast correction lens. However, the size of the effects is normally different for the first individual particle beams and the second individual particle beams since the first and the second individual particle beams generally have different energies.

According to an embodiment of the disclosure, the first contrast correction lens and/or a further contrast correction lens has a multi-part embodiment. A contrast correction lens can therefore form a subsystem of the contrast lens system with a plurality of lenses. In this case, it is possible that components of a contrast correction lens are arranged directly in succession or else separately from one another.

According to an embodiment of the disclosure, the multiple particle beam system moreover comprises a deflector array with a multiplicity of deflectors arranged next to one another, the deflector array being arranged in the region of an intermediate image plane in the second particle optical beam path, wherein the deflectors are configured to generate electric and/or magnetic deflection fields with an adjustable strength, wherein, during operation, the second individual particle beams pass through the deflector array and wherein the second individual particle beams are deflected by the deflection fields by deflection angles that depend on the strength of the deflection fields and wherein the controller is configured to control the strength of the electric and/or magnetic deflection fields. In this case, a single second individual particle beam or a group of second individual particle beams pass through each of the deflectors.

Such deflector arrays are also disclosed in WO 2019243349 A2, the entire disclosure of which is incorporated in this application by reference. A tilt of the second individual particle beams can also be corrected via the deflector array, and so the second individual particle beams can be exactly overlaid in the crossover at the contrast aperture. In this case, the aforementioned deflection angles can be greater than 10 µrad, for example greater than 15 µrad, for example greater than 100 µrad and for example greater than 300 µrad. To determine deflection angles and/or angles of incidence of the particle beam on a plane., the so-called centroid ray of the particle beam is usually used. The centroid ray represents the notional sum of the trajectories of all particles of the particle beam.

In this embodiment variant of the disclosure, the beam tilts caused by varying azimuthal velocity components can be corrected in steps. This can offer desirable features when using strong magnetic immersion objective lenses or in the case of large image fields in comparison with a sole correction by deflector arrays in the secondary path: This is because in such cases it is desirable to perform a first tilt correction via the contrast correction lens according to the disclosure on the second individual particle beams in order to strike the deflector array accurately enough for a desired residual correction and prevent problems with crosstalk between second individual particle beams.

According to an embodiment of the disclosure, the multiple particle beam system moreover comprises a deflector array with a multiplicity of deflectors arranged next to one another, the deflector array being arranged in the region of an intermediate image plane of the first particle beams, wherein the deflectors are configured to generate electromagnetic deflection fields with an adjustable strength, wherein, during operation, the first individual particle beams pass through the deflector array and wherein the first individual particle beams are deflected by the deflection fields by deflection angles that depend on the strength of the deflection fields and wherein the controller is configured to control the strength of the electromagnetic deflection fields.

Thus, in this embodiment variant, a mechanism correcting beam tilts in the secondary path (contrast correction lens(es) and optional deflector array in the secondary path) are combined with a mechanism correcting beam tilts in the primary path. In the primary path, this correction serves to ensure an exact telecentric illumination of the sample, to be precise even if a strong magnetic immersion lens is used as an objective lens. In the secondary path, the correction serves to set the homocentricity of the second individual particle beams or of the pencil of rays at the contrast aperture.

Depending on the positioning of the (optionally multipart) contrast correction lens(es) and of the deflector array; deflector arrays, it is also possible to carry out corrections of beam tilts on both the first individual particle beams and on the second individual particle beams via the same correction mechanism. Thus, the correction mechanism is then arranged where the first particle optical beam path and the second particle optical beam path overlap one another, i.e., between the sample and the beam switch, for example at the positions already explicitly mentioned above. Here, the extent of the correction to the first individual particle beams and the second individual particle beams usually greatly differs on account of the normally different particle energies. In that case, a post correction or stepwise correction of at least the beam tilts of the second individual particle beams can be desirable in the (pure) secondary path.

WO 2019243349 A2 discloses a first deflector array in the primary path, arranged in an intermediate image plane of the beam path of the primary particles. The first detector field is configured to influence the angles of incidence of the primary beams on the sample. What appropriate control of the individual deflectors of the deflector array achieves is that a tilt of the beams by the magnetic immersion lens is prevented, and so the beams are incident on the sample in telecentric fashion. A tilt of the secondary beams is then compensated by the contrast correction lens system according to the disclosure. Alternative mechanisms for influencing angles of incidence of the primary beams on the sample have also been disclosed by the German patent application with the file number 10 2019 004 124.0, the entire disclosure of which is incorporated in this application by reference: It discloses a magnetic multi-deflector array for deflecting the individual particle beams in the azimuthal direction. In this case, the multi-deflector array comprises a combination of a simple aperture plate with a singular opening and a multi-aperture plate, which are connected to one another in such a way that a cavity is formed between the two plates, a coil for generating the magnetic field being arranged in the cavity. This achieves specific field forming of a magnetic field which permits the easy setting of azimuth angles in the particle beam system individually for all individual particle beams. What is exploited here is the fact that an azimuthal (and radial) telecentricity error is substantially proportional to the distance of the respective individual particle beam from the optical axis of magnetic immersion lenses.

WO 2019243349 A2 discloses a second deflector array in the secondary path, arranged in an intermediate image plane of the beam path of the secondary particles. In one embodiment, a first contrast correction lens is arranged in the common beam path and used to compensate a tilt of both the primary and secondary particles. However, since these experience a different tilt on account of their energy difference, the first contrast correction lens in the common beam path can be embodied such that, for example, the tilt of the primary beams on the sample is compensated and a residual tilt of the secondary particles is compensated either by a second contrast correction lens in the secondary path or by the second deflector array in the secondary path.

It is also possible to combine a deflector array in the primary and secondary path with a contrast correction lens or contrast correction lenses in the primary or secondary path. For example, in the case of the grid arrangement of primary beams with a large number of beams, such as more than 300 individual beams, there is a very significant tilt of the outer beams. In this case, it is possible to largely compensate, for example by 90%, a large portion of a beam tilt using a contrast correction lens and to compensate a residual error of, e.g., 10% using a deflector array. Then, the deflector field need only be operated at lower voltages.

According to an embodiment of the disclosure, each of the deflectors comprises at least one pair of electrodes situated opposite one another, between which electrodes the second individual particle beams pass through the deflector, and the controller is configured to apply adjustable electric potentials that differ from one another to the electrodes of the pair of electrodes. A pair of electrodes situated opposite one another suffices for the deflections in one direction. Using a plurality of pairs of electrodes situated opposite one another allows a snore flexible adjustment of a direction correction. In this case, each deflector can have a plurality of pairs of electrodes situated opposite one another, for example two, three or four pairs, which each form four, six or eight individual electrodes, are usual.

According to an embodiment of the disclosure, the deflector array comprises a center and a connecting line between centers of the two electrodes of the pair of electrodes of each deflector is oriented in a circumferential direction with respect to the center of the deflector array. Using such a detector array, it is possible, for example, to influence particle beams whose trajectories have an azimuthal velocity component with respect to the optical axis so that the azimuthal velocity component is corrected after passing through the deflector array such that all individual particle beams are superposed in homocentric fashion in a subsequent cross-over.

According to an embodiment of the disclosure, each of the deflectors comprises at least a first plate and a second plate which are arranged in succession in the beam path, wherein the first plate has a first opening and the second plate has a second opening, second individual particle beams passing through the openings, wherein a center of the first opening, as viewed in the direction of the beam path, is laterally offset relative to a center of the second opening and wherein the controller is configured to apply electric potentials that differ from one another to the first and the second plate. These electric fields then lead to a deflection of the second individual particle beams passing through the openings.

According to an embodiment of the disclosure, the deflector array comprises a center and the center of the first opening, as viewed in the direction of the beam path, is offset laterally relative to the center of the second opening in a circumferential direction with respect to the center of the deflector array.

According to an embodiment of the disclosure, the plurality of deflectors of the deflector array have a common first multi-aperture plate with a multiplicity of first openings and a common second multi-aperture plate with a multiplicity of second openings, wherein one of the first openings and one of the second openings is passed through by the second individual particle beams in each case. Once again, it is possible here that only one second individual particle beam passes through each opening although this could also be a group of second individual particle beams.

The above-described embodiments of the disclosure can be combined with one another in full or in part, provided that no technical contradictions arise as a result.

BRIEF DESCRIPTION OF THE DRAWINGS

The disclosure will be understood even better with reference to the accompanying figures. In the figures.

DETAILED DESCRIPTION

Below, the same reference signs denote the same features, even if these are not explicitly mentioned in the text.

Figure 1:
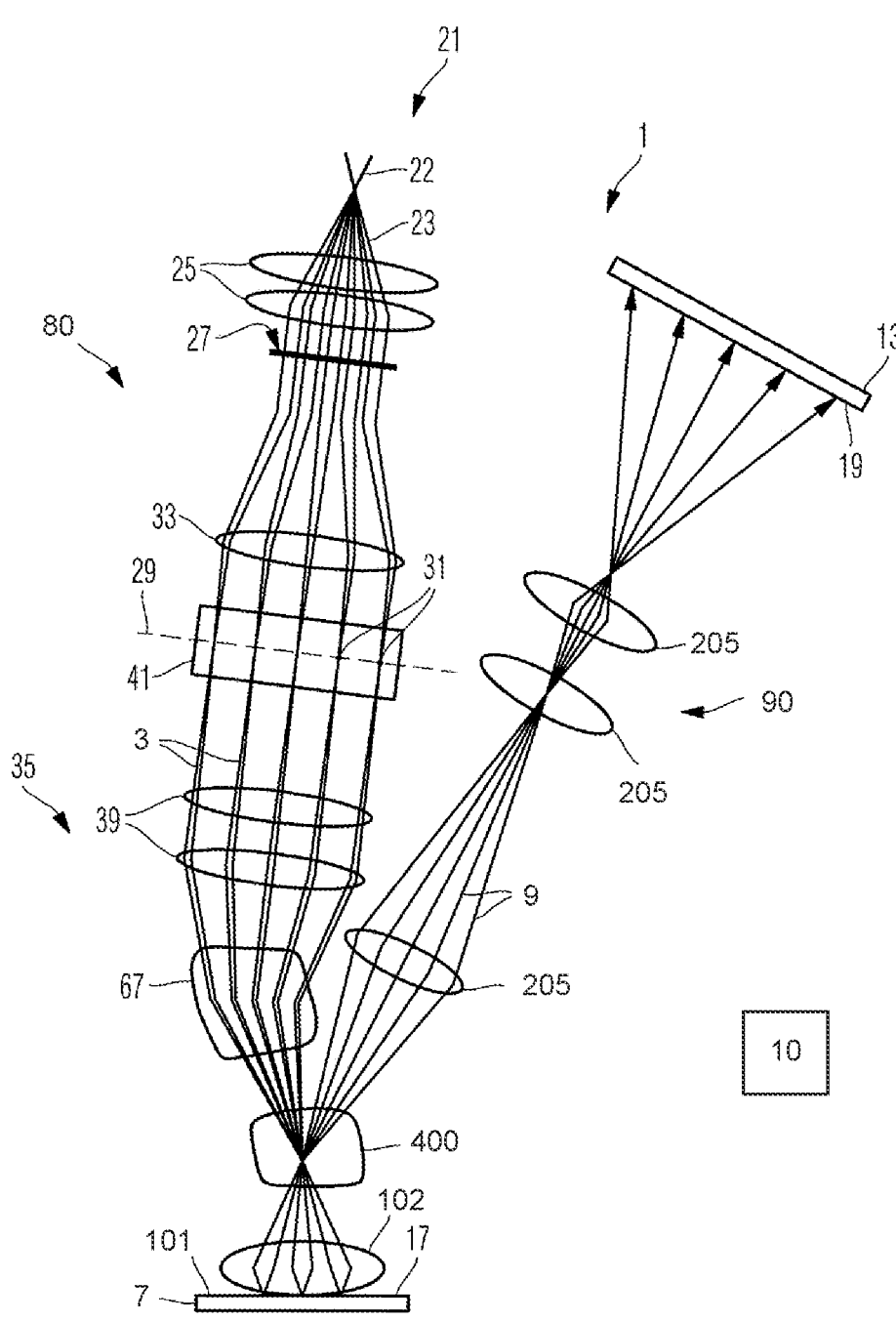
FIG. 1: shows a schematic illustration of a particle beam system in the form of a multi-beam particle microscope.

A particle beam system in accordance with one embodiment is illustrated schematically in FIG. 1. The particle beam system 1 comprises an illumination system 80 which comprises a first particle optical beam path and which is configured to direct a multiplicity of first particle beams 3 onto a plane 101 in which an object 7 is arranged. Each of the particle beams 3 illuminates an incidence location on the object 7, wherein the particle beams 3 are incident on the object 7 alongside one another and at a distance from one another, such that a field of incidence locations is illuminated there. The particle beams 3 can be electron beams, for example, which generate secondary electrons and backscattered electrons at the object 7. An imaging optical unit 90 of a detection system with a second particle optical beam path is configured to collect the electrons generated at the incidence locations and to direct them onto a detector array 13. Here electrons emanating from each of the incidence locations are used to shape in each case a separate particle beam 9. The particle beams 9 are directed onto the detector array 13. The detector array 13 comprises an array of detector elements, wherein one or more detector elements are provided for detecting a respective one of the particle beams 9. For this purpose, the detector elements are arranged in an array corresponding to the arrangement of the incidence locations at the object 7. The imaging optical unit 90 is configured with respect to the surface of the object 7 and the detector array 13 such that the surface of the object 7 is arranged in an object plane 101 of the imaging provided by the imaging optical unit 90 and the detector elements of the detector array 13 are arranged in an image plane 19 of the imaging. The imaging optical unit 35 of the illumination system 3 and the imaging optical unit 90 of the detector system are arranged such that the image plane 101 of the imaging optical unit 35 and the object plane of the imaging optical unit 90 coincide and the surface of the object can be arranged there. The plane 101 is thus the image plane of the illumination system 80, the object plane 17 of the imaging optical unit 30 and the sample plane in which the surface of an object 7 to be examined is arranged.

The illumination system 80 comprises a multi-beam particle source 21 having a particle emitter 22 for generating a particle beam 23, which is collimated by one or more condenser lenses 25 and impinges on a multi-aperture plate arrangement 27. The multi-aperture plate arrangement 27 comprises at least one multi-aperture plate having a multiplicity of openings. The particles of the particle beam 23 which pass through the openings in the multi-aperture plate form the particle beams 3. The multi-aperture plate arrangement 27 is furthermore configured to focus the individual particle beams 3, such that foci 31 of the particle beams 3 are formed in a region around a surface 29. In this case, the surface 29 can have a curved shape. Further lenses 33 that influence the beam path can be provided between the multi-aperture plate arrangement 27 and the surface 29.

The illumination system 80 furthermore comprises an imaging optical unit 35 configured to image the surface 29 into the plane 101, such that the surface 29 and the plane 101 are planes that are conjugate with respect to one another in the sense of an optical imaging. The imaging optical unit 35 comprises an objective lens 102, which is the lens of the imaging optical unit 35 which is arranged the closest to the plane 101. Furthermore, the imaging optical unit 35 can comprise further lenses 39.

The illumination system 80 directs the particle beams 3 onto the plane 101 in such a way that there the particle beams are incident on the plane 101 as far as possible orthogonally or in perpendicular fashion, i.e. at an angle of incidence of 90°. However, deviations from this relation arise on account of the properties of the lenses 39, such that the particle beams are incident on the plane 101 at angles of incidence that are different from 90°. For example, these directions are not identical for all of the particle beams 3, but rather can be dependent on the position of the respective particle beam 3 within the field of particle beams. The deviation of the angle of incidence from 90° may be caused by telecentricity errors of the imaging optical unit 35, for example. Furthermore, the objective lens 102 can provide its focusing effect via a magnetic field reaching as far as the surface of the object 7. The trajectories of the particle beams 3 directly at the surface of the object 7 then have the shape of helices. In order at least partly to compensate for such deviations from telecentricity in this exemplary embodiment, a deflector array 41 is arranged near the surface 29 which is imaged into the plane 101. However, this deflector array 41 can also be dispensed with.

Figure 2:
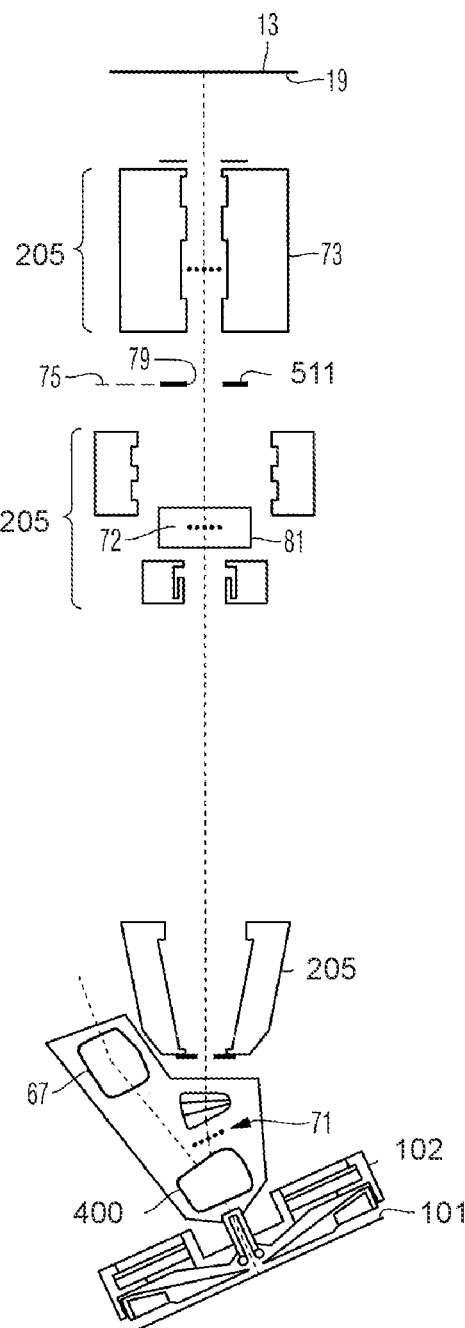
FIG. 2: shows a schematic illustration of a detail of the particle beam system of FIG. 1 with intermediate image planes and a contrast aperture.

The imaging optical unit 90 comprises the objective lens 102 and a plurality of lenses 205, which are illustrated schematically in FIG. 1 and in greater detail in FIG. 2. The imaging optical unit 90 images the plane 17 onto the plane 19 in which the detector elements of the detector array 13 are arranged in such a way that three intermediate images 71, 72 and 73 arise one behind another along the beam path of the particle beams 9. Furthermore, there is a cross-over of the particle beams 9 in a plane 75 arranged in the beam path between the intermediate images 72 and 73 (see FIG. 2). There is arranged in the plane 75 a contrast aperture 511 having a cutout 79, which serves to filter out particles of the particle beams 9 which would otherwise impinge on a detector element of the detector array 13 which is different from the detector element(s) assigned to that location in the plane 101 from which the particle has started.

As explained above the quality of this filtering is reduced if the particle beams 9 start from the plane 101 or 17 non-orthogonally, i.e. at angles which are different from 90°. Furthermore, the filtering quality is also reduced even if the particle beams start orthogonal, but within a magnetic field.

This occurs in practice for example if the objective lens 102 generates a focusing magnetic field which reaches as far as the plane 101.

In order to compensate for this, a deflector array 81 can be arranged in the region of the intermediate image 72, the deflector array comprising an array of deflectors, wherein one of the particle beams 9 passes through each of the deflectors. The deflectors deflect the particle beams 9 passing through them in such a way that the latter pass through the smallest possible region in the plane 75, and the opening 79 can be chosen to be small enough to achieve a good filtering with a high throughput.

Figure 9:
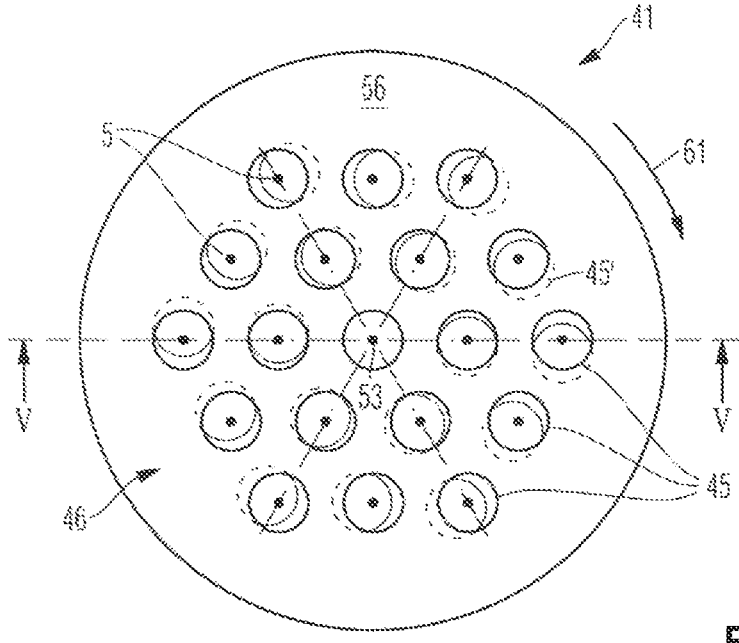
FIG. 9: shows a schematic illustration of a plan view of a further deflector array which is usable in the particle beam system of FIG. 1.
Figure 10:
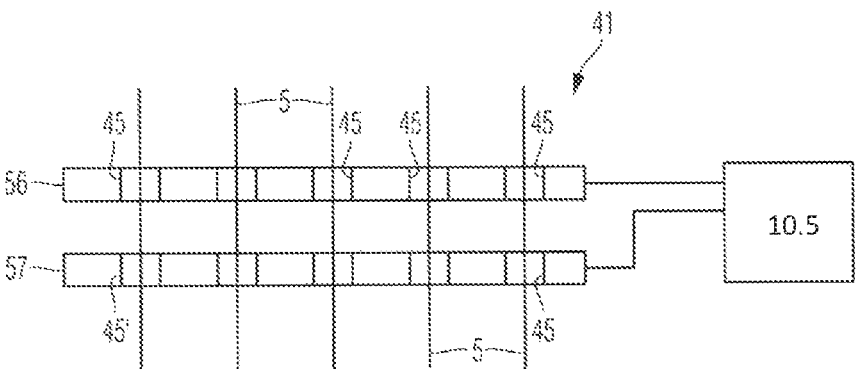
FIG. 10: shows a schematic illustration of a cross-sectional view of the deflector array illustrated in FIG. 9 along a line VI-VI.

The deflector array 81 can have a structure as will be explained below with reference to FIGS. 8 to 10. However, a deflector array 81 need not be present.

The multiple particle beam system furthermore comprises a computer system 10 configured both for controlling the individual particle optical components of the multiple particle beam system and for evaluating and analysing the signals obtained by the detector array 13. In this case, the computer system 10 can be constructed from a plurality of individual computers or components. It can also control the contrast correction lens system 500 according to the disclosure (not illustrated in FIGS. 1 and 2).

Further information relating to such multi-beam particle beam systems and components used therein, such as, for instance, particle sources, multi-aperture plate and lenses, can be obtained from the international patent applications WO 2005/024881, WO 2007/028595, WO 2007/028596, WO 2011/124352 and WO 2007/060017 and the German patent applications having the application numbers DE 10 2013 026 113.4 and DE 10 2013 014 976.2, the disclosure of which in the full scope thereof is incorporated by reference in the present application.

Figure 3:
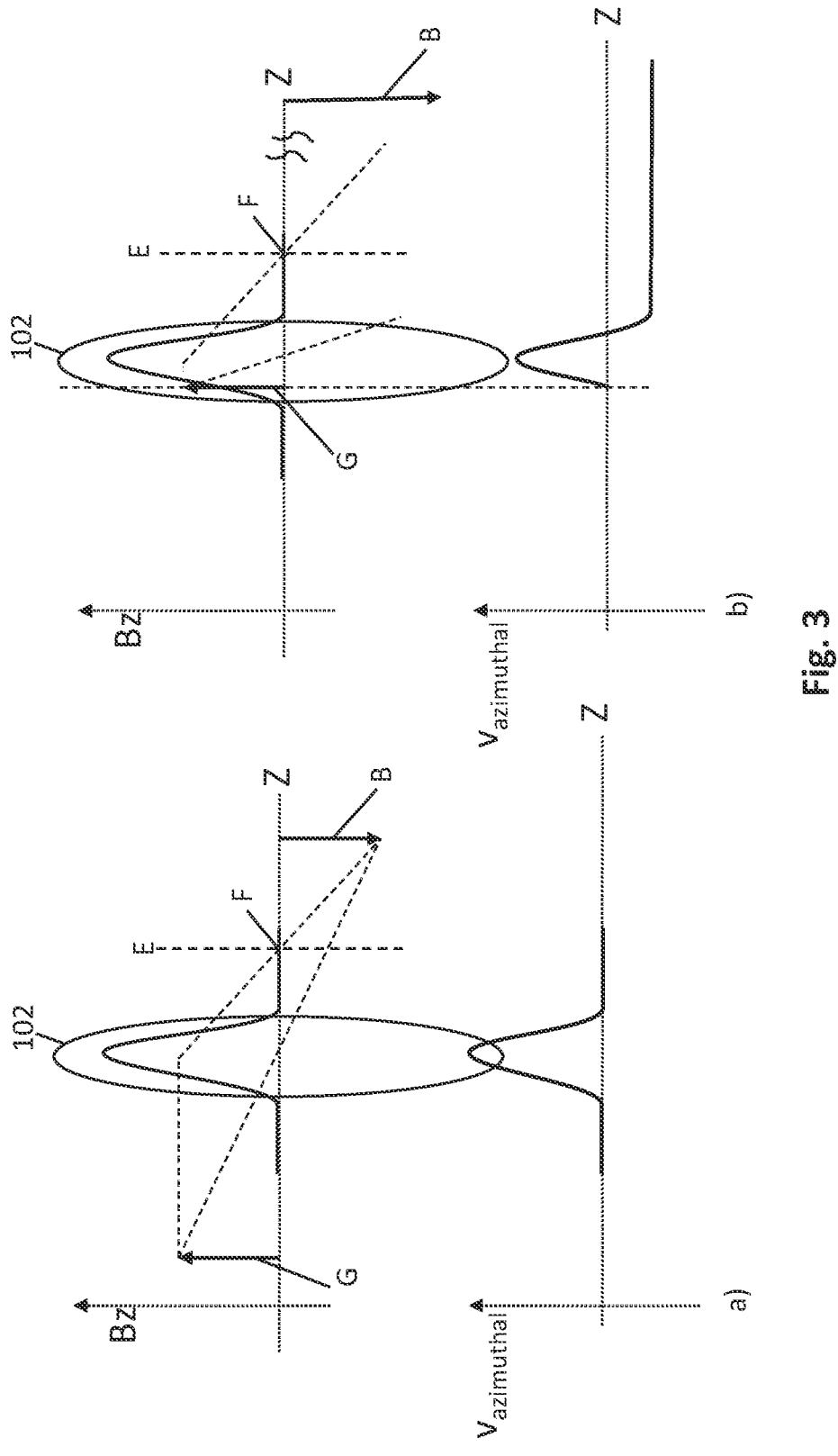
FIG. 3: schematically illustrates particle-optical imaging through a symmetric and through an asymmetric magnetic lens.

FIG. 3 schematically illustrates particle-optical imaging through a symmetric and through an asymmetric magnetic lens and should illustrate how beam tilting arises. FIG. 3a) shows the imaging through a symmetric magnetic lens, e.g., through a magnetic objective lens 102. The y-axis plots the z-component Bz of the magnetic field caused by the lens. The object G to be imaged, represented by an upright arrow, is situated upstream of the magnetic objective lens 102 in relation to the optical axis Z. The particle optical image B arises downstream of the magnetic objective lens 102. In this case, the object G to be imaged is situated outside of the magnetic field of the objective lens 102. Now, a particle optical beam path for a parallel beam, which is imaged through the focus F in the focal plane E, is plotted in exemplary fashion. Furthermore, the central beam is plotted.

Now, the azimuthal velocity component $v_{azimutal}$ of a field beam starting from the sample in perpendicular fashion is plotted below the schematically sketched beam paths through the objective lens 102. The off-axis electrons which belong to the field beam and which start from the sample in perpendicular fashion, i.e., without an azimuthal velocity component, rotate in the lens and leave the lens field without an azimuthal velocity component. Subsequently, the started electrons meet in the focal plane and clean filtering of the electrons according to the start angles is possible in the focal plane via a contrast aperture (not illustrated). As a consequence, this filtering facilitates homogeneous contrasts, even over a large image field.

For comparison purposes, FIG. 3b) illustrates the particle optical beam path for the case where the magnetic lens 102 is a magnetic immersion lens. Here, the object G or sample to be imaged is therefore situated within the magnetic field of the lens 102. Thus, the magnetic field experienced and traversed by the electrons is not symmetric but asymmetric. The azimuthal velocity component $v_{azimutal}$ after passing through the lens 102 does not equal zero. An off-axis electron which starts from the sample in perpendicular fashion, i.e., without an azimuthal velocity component, rotates in the magnetic lens 102 and leaves the lens field with an azimuthal velocity component on account of the asymmetry. This azimuthal velocity component leads to tilt of the electron beams or secondary beams. As a consequence, electrons that started from the sample in parallel no longer meet in homocentric fashion in the focal plane E. It is no longer possible to carry out high precision filtering according to start angles in the focal plane. Errors and, as a consequence, contrast drifts over the image field arise.

Figure 4:
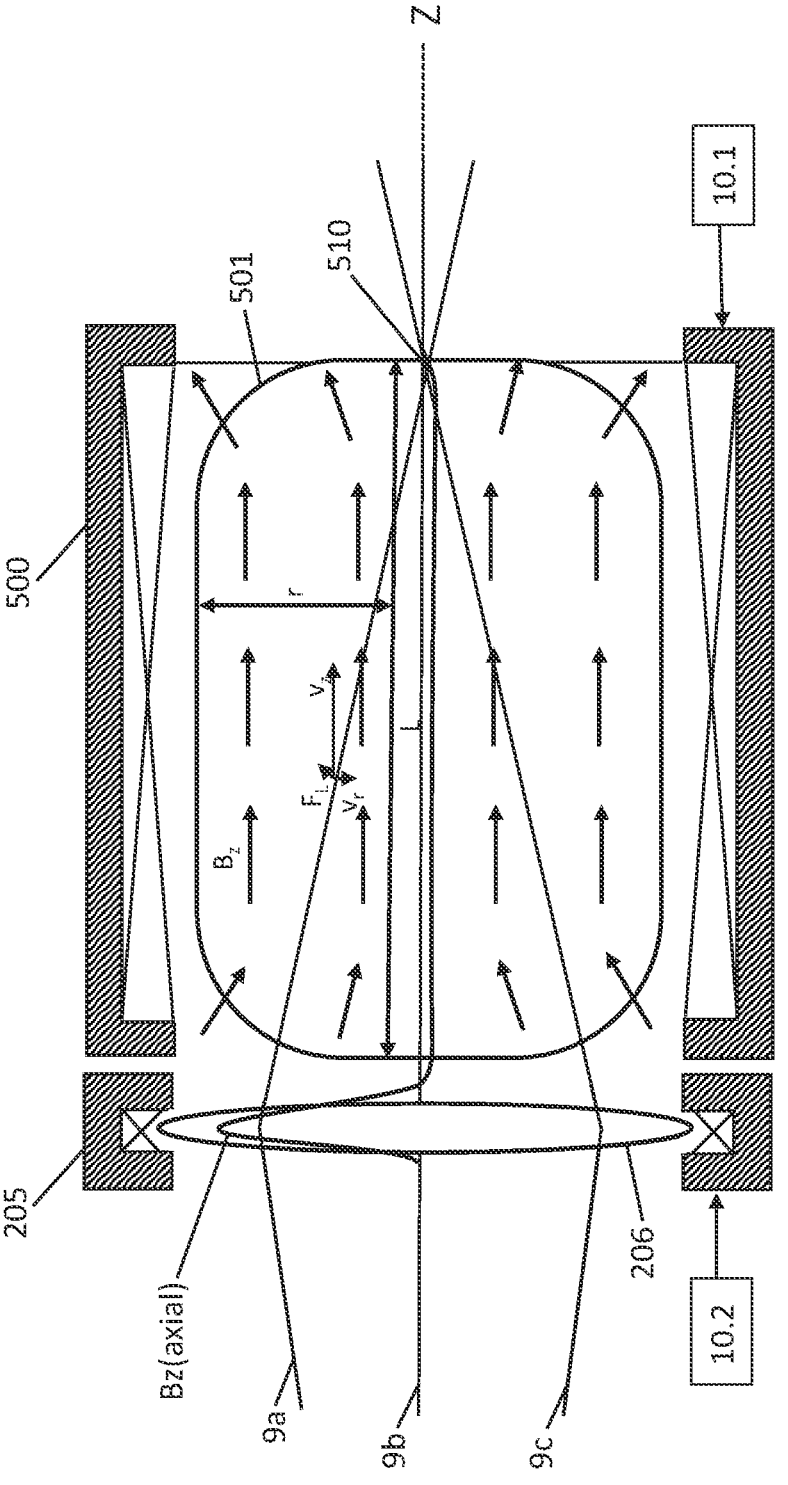
FIG. 4: shows a schematic illustration of a magnetic contrast correction lens.

FIG. 4 shows a schematic illustration of a magnetic contrast correction lens 500. In FIG. 4, the contrast correction lens 500 according to the disclosure is arranged downstream of a magnetic projection lens 205 in the particle optical beam path. This projection lens 205 can be one of more than one projection lenses of a projection lens system. It would also be possible for a different particle optical lens, for example an objective lens 102, to be provided in place of the projection lens 205. In this respect, FIG. 4 only serves illustrative purposes and for a better understanding of the concept of the disclosure. Hence, the magnetic contrast correction lens 500 is arranged in a region in which the pencil of second individual particle beams runs in convergent fashion.

In exemplary fashion, FIG. 4 plots the beam path of three second individual particle beams 9a, 9b and 9c. The projection lens 205 is a strongly refractive lens. The second individual particle beams 9a, 9b and 9c are thereby focused on the cross-over 510 as well. By contrast, the magnetic contrast correction lens 500 is a magnetic lens with a weak magnetic field. Here, the magnetic field acts in the region 501 and the direction of the magnetic field is indicated by arrows in FIG. 4. Generally, the magnetic field is aligned parallel to the optical axis Z; this is indicated by the label $B_z$ at one of the arrows.

The charged second individual particle beams or electrons 9a, 9b and 9c have different radial velocity components. The Lorentz force FL acts on velocity components $v_r$ in the radial direction—brought about by the magnetic field $B_z$. This leads to a helical movement of the charged particles in the magnetic field 501. The helical movement of the charged particles becomes ever more pronounced or the Lorentz force becomes stronger the further a charged particle beam 9a, 9b and 9c is situated from the optical axis Z since the velocity component $v_r$ is greater in this case. By way of appropriate control via the controller 10.1 the magnetic field 501 of the contrast correction lens 500 can be chosen so that the Larmor rotation generated here counteracts, e.g., the azimuthal tilt caused by the magnetic immersion lens. The contrast correction lens should now be set so that particles that started from the sample with the same angles and energies, for example perpendicular to the surface of a semiconductor wafer, meet again in the crossover and the Larmor rotation or remanent tilt of the individual particle beams is compensated exactly. For this compensation it is sufficient if the charged particles carry out less than an entire rotation or twist in the magnetic field 501. The magnetic field 501 can be chosen to be correspondingly weak provided an appropriate drift path is available within the magnetic field. In the example shown, the drift path or length L of the contrast correction lens 500 or of the effective magnetic field 501 generated thereby is approximately 20 cm. However, it might also be 10 cm or 30 cm and other lengths are also possible. In the example shown, the radius r of the magnetic field is approximately 5 cm.

When the magnetic field 501 is departed, the unwanted tilt of the second individual particle beams 9a, 9b and 9c caused by the magnetic field of the magnetic immersion lens is exactly compensated. Consequently, the second individual particle beams 9a, 9b and 9c can be superposed exactly in the cross-over 510. Consequently, the second individual particle beams can now be filtered according to their start angle distribution on the sample with the aid of a contrast aperture (not plotted). In one example, filtering is carried out in each case according to a central beam of each second individual particle beam, wherein the central beams are aligned perpendicular to the surface of a semiconductor wafer arranged in the plane 101.

Figure 5:
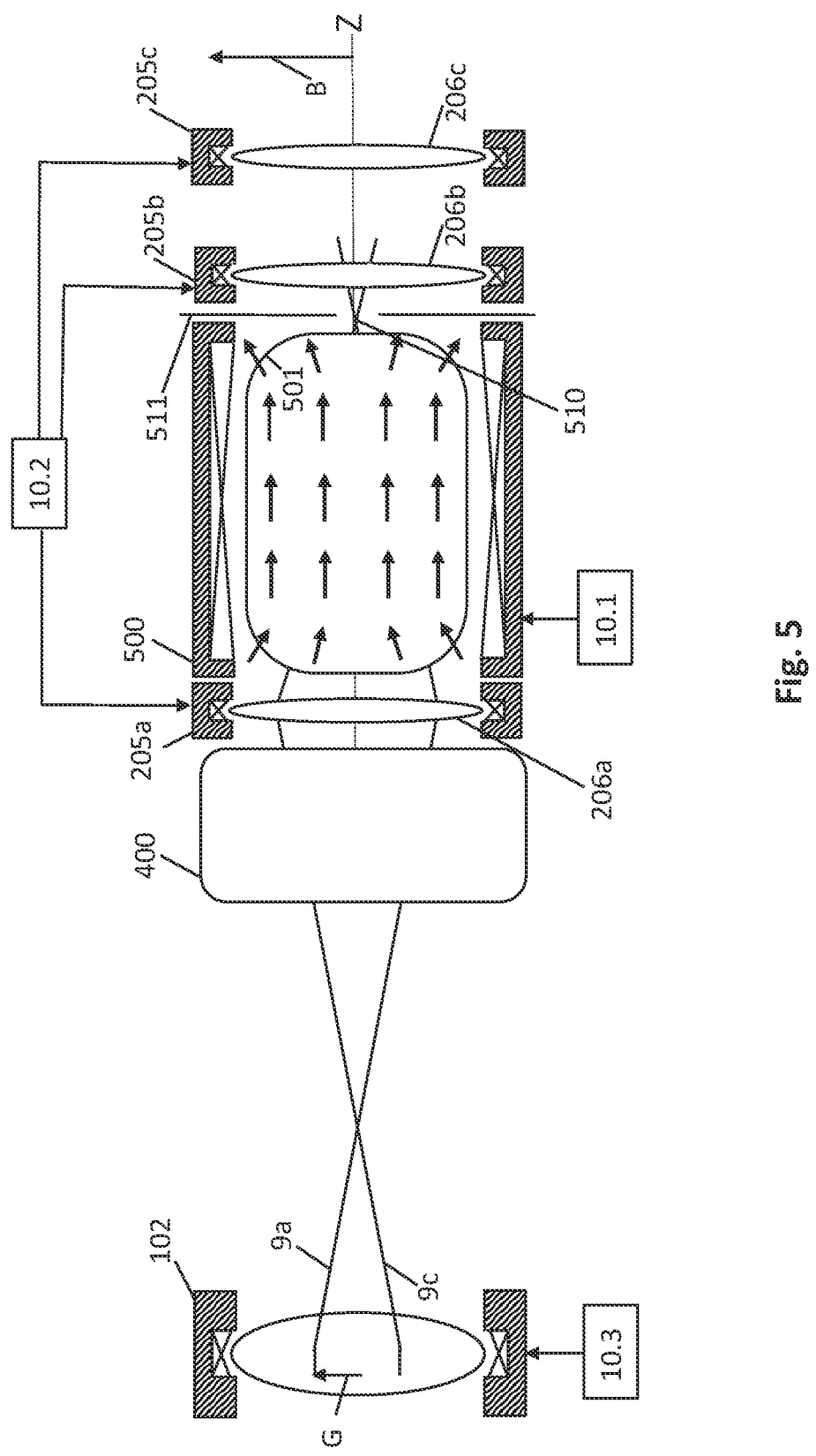
FIG. 5: schematically shows a first arrangement of a magnetic contrast correction lens in a multiple particle beam system.
Figure 6:
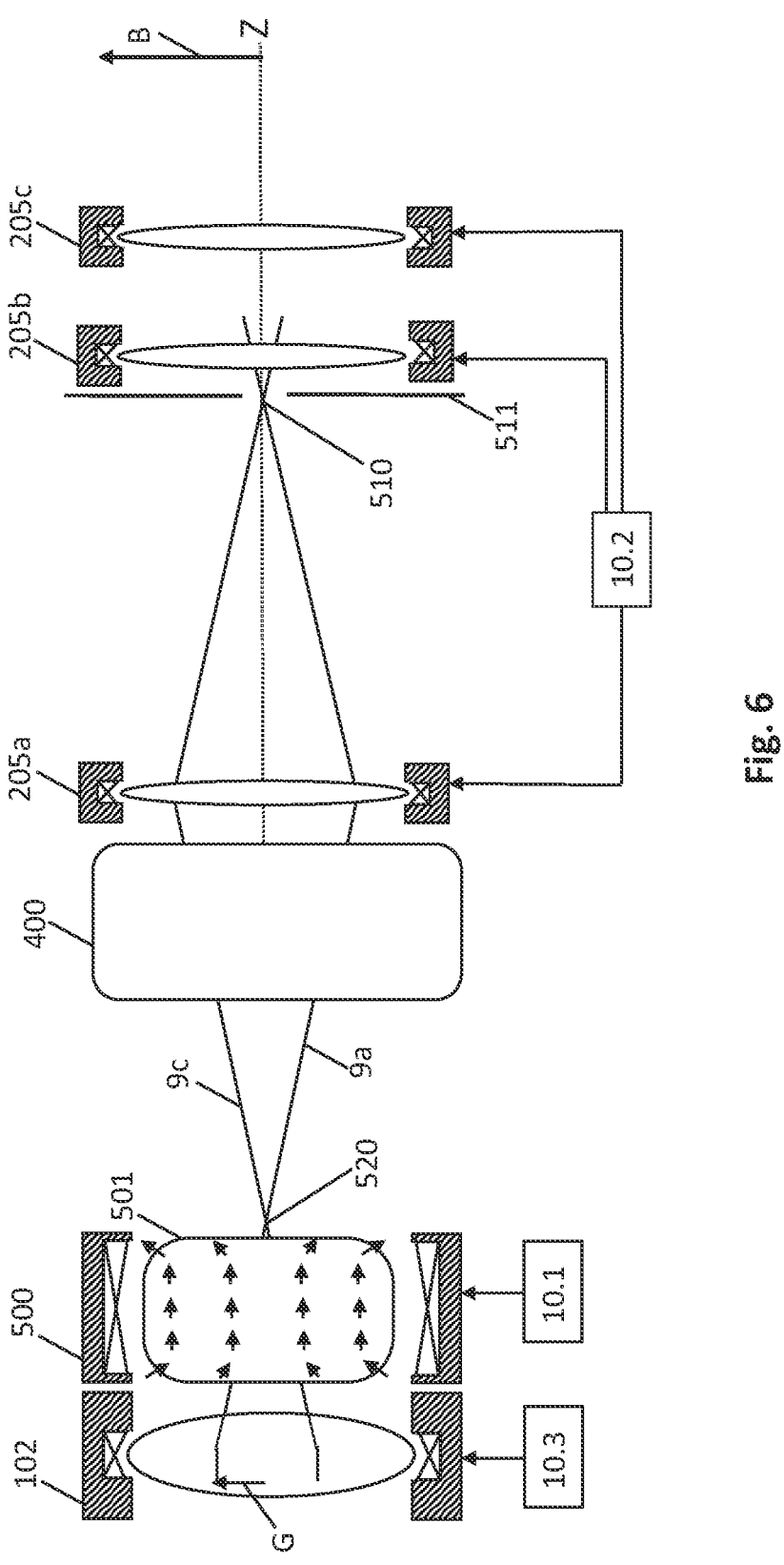
FIG. 6: schematically shows a second arrangement of a magnetic contrast correction lens in a multiple particle beam system.
Figure 7:
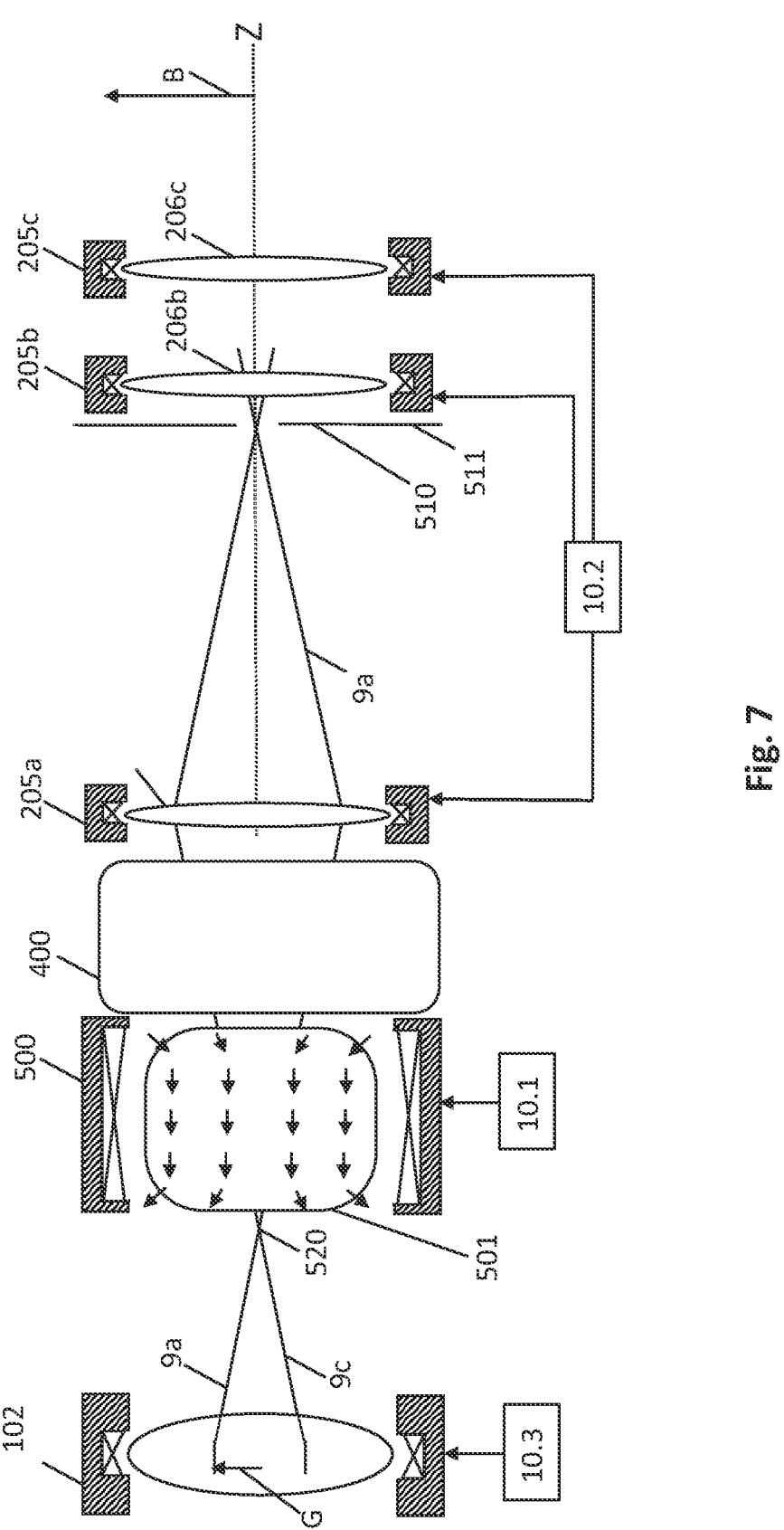
FIG. 7: schematically shows a third arrangement of a magnetic contrast correction lens in a multiple particle beam system.

FIGS. 5, 6 and 7 schematically show a first arrangement, a second arrangement and a third arrangement of a magnetic contrast correction lens 500 in a multiple particle beam system 1. In this case, the object G or sample is situated within the magnetic field of the objective lens; by way of example, this is a strong magnetic immersion lens 102 in this case. On account of the Larmor rotation, the second individual particle beams 9a, 9c are slightly tilted in the azimuthal direction after the departure from the immersion lens 102 and so they would not meet exactly in the crossover 510 without the contrast correction lens 500 according to the disclosure. The second individual particle beams 9a, 9c emanating from the sample now pass through the beam switch 400 and, subsequently, a projection lens system 205 which comprises three projection lenses 205a, 205b and 205c in the example shown. These are magnetic projection lenses 205a, 205b and 205c in the example shown. However, it would also be possible to use electric projection lenses or electromagnetic projection lenses. The contrast correction lens 500 is arranged within the projection lens system 205 in this embodiment. Specifically, it is situated between the first projection lens 205a and the second projection lens 205b and, expressed differently, it is situated between the projection lens 205a, arranged upstream of the contrast aperture 511 and the crossover 510 in the particle optical beam path, and the contrast aperture 511. Normally, sufficient installation space is available at this point in the multiple particle beam system 1 in order to arrange a comparatively long contrast correction lens 500 in the second particle optical beam path.

In the example shown, the particle optical components in the second particle optical beam path are controlled by components of the controller 10, in this case components 10.1, 10.2 and 10.3. As a result of the targeted control, it is possible to optimize the particle optical beam path and, for example, ensure that the second individual particle beams 9a, 9c are exactly homocentrically superposed in the crossover 510 by way of an exact compensation of the Larmor rotation via the contrast correction lens.

In FIG. 6, the contrast correction lens 500 is positioned differently to the one embodiment illustrated in FIG. 5: The contrast correction lens 500 is situated between the objective lens 102 and the beam splitter 400. Specifically, the contrast correction lens 500 is arranged between the objective lens 102 and the upper focal plane 520 of the objective lens 102. In this embodiment variant, an appropriate compensation of the Larmor rotation is undertaken as soon as the unwanted azimuthal tilt of the individual particle beams arises. However, when positioning the contrast correction lens 500 according to the disclosure at this position, it is desirable—on account of the restricted space—to work with a stronger magnetic field for compensating Larmor rotation.

In the embodiment illustrated in FIG. 7, the contrast correction lens 500 according to the disclosure is likewise situated between the objective lens 102 and the beam splitter 400. However, it is the case in this embodiment variant that the contrast correction lens 500 is arranged between the upper focal plane 520 of the objective lens 102 and the beam switch 400. The second individual particle beams run divergently in this region, and so the direction of the magnetic field within the contrast correction lens 500 has to be reversed in comparison with the two other exemplary embodiments in FIGS. 5 and 6.

It is also possible to fully or partly combine the exemplary embodiments of FIGS. 5, 6 and 7. Then, the contrast correction lens system can have a first, second and/or a third contrast correction lens, or even more contrast correction lenses. In this case, each contrast correction lens can have a single part or multi-part design. Moreover, the exemplary embodiments of FIGS. 5, 6 and 7 can be fully or partly combined with the embodiments of the deflector arrays 41 described in FIGS. 8, 9 and 10.

Figure 8:
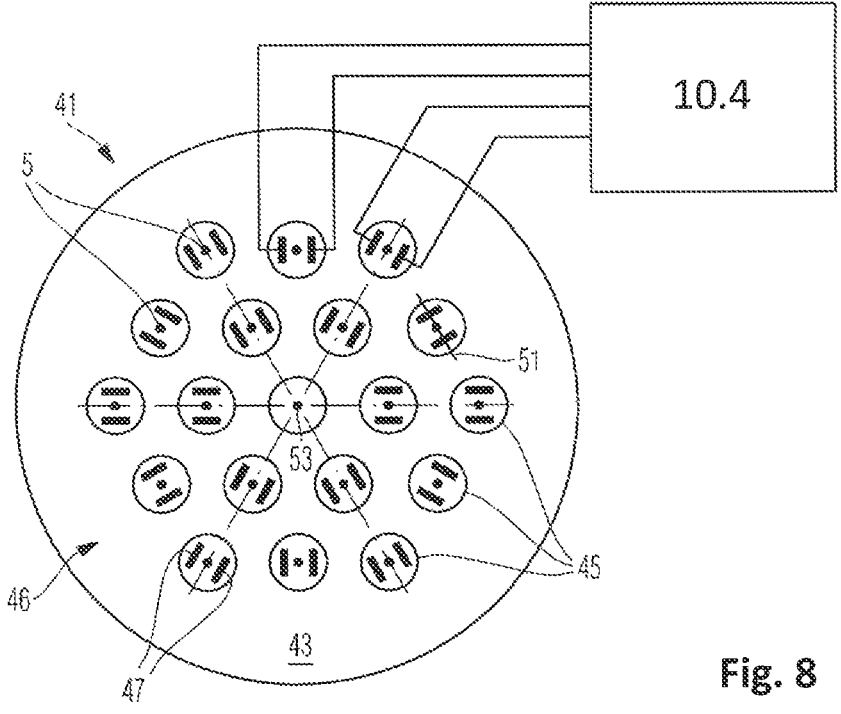
FIG. 8: shows a schematic illustration of a plan view of a deflector array which is usable in the particle beam system of FIG. 1.

FIG. 8 schematically illustrates a plan view of an embodiment of the deflector array 41. Such a deflector array 41 can be arranged in an intermediate image plane of the first and/or second particle optical beam path and allows an individual direction correction of particle beams. Deflection angles can be set on an individual basis via a controller.

The deflector array 41 comprises a multi-aperture plate 43 having a multiplicity of openings 45 arranged in an array 46 in such a way that one of the second individual particle beams 9 passes centrally through each of the openings 45. At each opening 45, at least one pair of electrodes 47 situated opposite one another is arranged on both sides of the midpoint of the opening 45. Each electrode 47 is connected to a controller 10.4 configured to apply mutually different electrical potentials to the electrodes 47 of each pair of electrodes. The potential difference between the electrodes 47 of a pair of electrodes 47 generates an electric field between the electrodes 47, the electric field deflecting the particle beam 9 passing through the pair of electrodes 47 by an angle dependent on the potential difference.

The pairs of electrodes 47 are oriented with respect to the particle beams 5 passing through the latter in such a way that a connecting line 51 between centers of the two electrodes 47 of the pair is arranged in a circumferential direction with respect to a center 53 of the array 46 of the openings 45 through which the particle beams 5 pass. As a result, it is possible to deflect the particle beams 5 such that the effect of a magnetic field extending from the objective lens 102 to the surface of the object 9 is compensated.

In the case of the deflector array 41 illustrated in FIG. 8, each individual deflector has a pair of electrodes 47 situated opposite one another and arranged offset in a circumferential direction with respect to the center 53. It is thereby possible to deflect the particle beams in directions which are oriented in a circumferential direction with respect to the center. It is also possible however for two or more pairs of electrodes situated opposite one another to be arranged in a distributed manner in a circumferential direction around the opening in order also to be able to set the orientations in which the particle beam passing through the plurality of pairs of electrodes is deflected.

An embodiment of a deflector array 41 is explained below with reference to FIGS. 9 and 10. In this case, FIG. 9 shows a plan view of the deflector array 41 and FIG. 10 shows a cross section through the deflector array 41 along a line V-V in FIG. 9.

The deflector array 41 comprises a first multi-aperture plate 56 having a multiplicity of openings 45, and a second multi-aperture plate 57 having a multiplicity of openings 45', through which the particle beams 5 pass. The two multi-aperture plates 56 and 57 are arranged one behind the other in the beam path, such that each particle beam 5 passes firstly through an opening 45 in the first multi-aperture plate 56 and then through an opening 45' in the second multi-aperture plate 57. The openings 45 and 45' in the two multi-aperture plates 56 and 57 can each have an identical diameter. However, this need not be the case.

The two multi-aperture plates 56 and 57 are arranged relative to one another such that a center of the opening 45 in the first multi-aperture plate 56, through which opening a given particle beam passes, is offset laterally relatively to a center of the opening 45' in the second multi-aperture plate 57, through which opening the particle beam passes, as viewed in the beam direction. This is illustrated in FIG. 8 by the fact that the openings 45 in the first multi-aperture plate 56 are entirely visible and are illustrated as solid lines, while the openings 45' in the second multi-aperture plate 57 are partly concealed and, in so far as they are visible, are illustrated by solid lines and, in so far as they are concealed, are illustrated by interrupted lines.

A controller 10.5 is configured to apply mutually different electrical potentials to the first multi-aperture plate 56 and to the second multi-aperture plate 57. Electrostatic fields are thereby generated between the multi-aperture plates 56 and 57, the electrostatic fields deflecting the particle beams 5. The deflection angle can be set via the potential difference between the multi-aperture plates 56 and 57 that is determined by the controller 10.5.

The deflector array comprises a center 53, around which the second multi-aperture plate 57 is rotated relative to the first multi-aperture plate 56, as is illustrated by an arrow 61 in FIG. 8. This rotation produces a lateral offset in a circumferential direction around the center 53 between the openings 45 and 45', through which the particle beam 9 passes successively, wherein the lateral offset increases in a circumferential direction with increasing distance between the respective openings 45 and 45' and the center 53.

LIST OF REFERENCE SIGNS

1 Multi-beam particle microscope
3 Primary particle beams (individual particle beams)
7 Object
9 Secondary particle beams
10 Computer system, controller with a plurality of components
13 Detector array
19 Plane of the detector elements
21 Multi-beam particle source
22 Particle emitter
23 Particle beam
25 Condenser lenses
27 Multi-aperture plate arrangement
29 Surface of the foci
31 Foci
33 Lenses
35 Imaging optical unit
39 Lens
41 Deflector array
43 Multi-aperture plate
45 Opening
46 Field
47 Electrode 51 Connecting line
53 Center
56 First multi-aperture plate
57 Second multi-aperture plate
67 Region of a homogenous magnetic field
71 Intermediate image
72 Intermediate image
73 Intermediate image
75 Plane of the cross-over
79 Opening
80 Illumination system
81 Deflector array
90 Imaging optical unit
101 Object plane
102 Objective lens
205 Projection lens
206 Region of the magnetic field
400 Beam switch
500 Contrast correction lens
501 Region of the magnetic field
510 Cross-over
511 Contrast aperture
520 Cross-over in the upper focal plane of the objective lens
Z Optical axis
G Object
B Image
Bz Magnetic field
L Length of the effective magnetic field
r Radius of the effective magnetic field
What is claimed is:

1. A multiple particle beam system, comprising:
a multi-beam particle source configured to generate a first field of a multiplicity of charged first individual particle beams;
a first particle-optical unit having a first particle-optical beam path, the first particle-optical unit configured to image the first individual particle beams onto an object plane so that the first individual particle beams strike an object at incidence locations defining a second field;
a detection system comprising a multiplicity of detection regions defining a third field;
a second particle optical unit having a second particle optical beam path, the second particle optical unit configured to image second individual particle beams emanating from the second field onto the third field;
a magnetic objective lens configured so that the first and the second individual particle beams pass therethrough;
a beam switch;
a contrast aperture having a central cutout;
a contrast correction lens system comprising a first magnetic contrast correction lens; and
a controller configured to control excitation of the contrast correction lens system,
wherein:
the beam switch is in the first particle optical beam path between the multi-beam particle source and the magnetic objective lens;
the beam switch is in the second particle optical beam path between the magnetic objective lens and the detection system;
the second individual particle beams have a cross-over in the second particle optical beam path between the beam switch and the detection system;
the central cutout is in a region of the cross-over;
the central cutout is configured to cut out the second individual particle beams;

the contrast correction lens system is in the second particle optical beam path between the magnetic objective lens and the contrast aperture;
the contrast correction lens system is configured to generate a magnetic field having an adjustable strength to correct beam tilts of the second individual particle beams in the cross-over in relation to an optical axis of the multiple particle beam system;
the second particle optical unit comprises first and second projection lens systems; and
the first magnetic contrast correction lens is arranged between the first projection lens system and the second projection lens system.

2. The multiple particle beam system of claim 1, wherein the first magnetic contrast correction lens is arranged in a region where the second individual particle beams run in convergent or divergent fashion during operation of the multiple particle beam system.

3. The multiple particle beam system of claim 1, wherein excitation of the contrast correction lens system is controlled so that, after passing through the contrast correction lens system, the second individual particle beams have substantially no azimuthal velocity components in a plane selected from the group consisting of a subsequent image plane and an intermediate image plane of the second particle optical beam path.

4. The multiple particle beam system of claim 1, wherein excitation of the contrast correction lens system is controlled so that all second individual particle beams pass through the cross-over centrally in relation to the optical axis of the system.

5. The multiple particle beam system of claim 1, wherein a magnetic field of the first magnetic contrast correction lens is aligned substantially parallel to the optical axis of the system.

6. The multiple particle beam system of claim 1, wherein the first magnetic contrast correction lens has a length that is greater than a radius of the first magnetic contrast correction lens.

7. The multiple particle beam system of claim 6, wherein the length of the first magnetic contrast correction lens is at least twice the radius of the first magnetic contrast correction lens.

8. The multiple particle beam system of claim 1, wherein a length of the first magnetic contrast correction lens is at least 15 centimeters.

9. The multiple particle beam system of claim 1, wherein the magnetic objective lens comprises a magnetic immersion lens.

10. The multiple particle beam system of claim 9, wherein the magnetic immersion lens is configured to provide a focusing magnetic field having a magnetic field strength in the object plane of greater than 10 milliTesla.

11. The multiple particle beam system of claim 1, wherein the first projection lens system comprises a magnetic projection lens.

12. The multiple particle beam system of claim 1, wherein the first projection lens system comprises an electric projection lens.

13. The multiple particle beam system of claim 1, wherein the first magnetic contrast correction lens is between the contrast aperture and the first projection lens system.

14. The multiple particle beam system of claim 1, wherein the contrast correction lens system comprises a second contrast correction lens.

15. The multiple particle beam system of claim 1, wherein the first magnetic contrast correction lens is between the magnetic objective lens and the beam switch.

16. The multiple particle beam system of claim 1, wherein the first magnetic contrast correction lens is between the magnetic objective lens and an upper focal plane of the magnetic objective lens.

17. The multiple particle beam system of claim 1, wherein the first magnetic contrast correction lens is between an upper focal plane of the magnetic objective lens and the beam switch.

18. The multiple particle beam system of claim 1, wherein the first magnetic contrast correction lens comprises multiple parts.

19. The multiple particle beam system of claim 1, further comprising a deflector array comprising a multiplicity of deflectors arranged next to one another, wherein the deflector array is in a region of an intermediate image plane.

20. A multiple particle beam system, comprising:

a multi-beam particle source configured to generate a first field of a multiplicity of charged first individual particle beams;

a first particle-optical unit having a first particle-optical beam path, the first particle-optical unit configured to image the first individual particle beams onto an object plane so that the first individual particle beams strike an object at incidence locations defining a second field;

a detection system comprising a multiplicity of detection regions defining a third field;

a second particle optical unit having a second particle optical beam path, the second particle optical unit configured to image second individual particle beams emanating from the second field onto the third field;

a magnetic objective lens configured so that the first and the second individual particle beams pass therethrough;

a beam switch;

a contrast aperture having a central cutout;

a contrast correction lens system comprising a first magnetic contrast correction lens; and a controller configured to control excitation of the contrast correction lens system, wherein:

the beam switch is in the first particle optical beam path between the multi-beam particle source and the magnetic objective lens;

the beam switch is in the second particle optical beam path between the magnetic objective lens and the detection system;

the second individual particle beams have a cross-over in the second particle optical beam path between the beam switch and the detection system;

the central cutout is in a region of the cross-over;

the central cutout is configured to cut out the second individual particle beams;

the contrast correction lens system is in the second particle optical beam path between the magnetic objective lens and the contrast aperture;

the contrast correction lens system is configured to generate a magnetic field having an adjustable strength to correct beam tilts of the second individual particle beams in the cross-over in relation to an optical axis of the multiple particle beam system;

the second particle optical unit comprises a projection lens system; and the first magnetic contrast correction lens is between the contrast aperture and the projection lens system.

* * * * *